(12) United States Patent
Hou et al.

(10) Patent No.: US 12,733,187 B2
(45) Date of Patent: Sep. 8, 2026

(54) METAL-INSULATOR-METAL CAPACITOR STRUCTURE

(71) Applicant: UNITED MICROELECTRONICS CORP., Hsin-Chu City (TW)

(72) Inventors: Tai-Cheng Hou, Tainan City (TW); Da-Jun Lin, Kaohsiung City (TW); Bin-Siang Tsai, Changhua County (TW); Fu-Yu Tsai, Tainan City (TW); Ya-Yin Hsiao, Taipei City (TW); Po-Ching Su, Tainan City (TW); Yi-Fan Li, Tainan City (TW); Kuan-Jhih Hou, Chiayi County (TW); Yu-Fu Wang, Taoyuan City (TW); Ti-Bin Chen, Tainan City (TW); Chih-Chiang Wu, Tainan City (TW); Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 423 days.

(21) Appl. No.: 18/408,595

(22) Filed: Jan. 10, 2024

(65) Prior Publication Data

US 2025/0212426 A1 Jun. 26, 2025

(30) Foreign Application Priority Data

Dec. 20, 2023 (TW) ................................ 112149801

(51) Int. Cl.
*H10D 1/68* (2025.01)
*H10W 70/63* (2026.01)

(52) U.S. Cl.
CPC .......... *H10D 1/696* (2025.01); *H10W 70/635* (2026.01)

(58) Field of Classification Search
CPC ...... H10D 1/665; H10D 1/696; H10W 70/635
See application file for complete search history.

(56) References Cited

U.S. PATENT DOCUMENTS

| | | | |
|---|---|---|---|
| 6,746,929 | B2 | 6/2004 | Yoshitomi |
| 2004/0137694 | A1 | 7/2004 | Lee |

(Continued)

OTHER PUBLICATIONS

S. Y. Hou et al., Integrated Deep Trench Capacitor in Si Interposer for CoWoS Heterogeneous Integration, IEEE International Electron Devices Meeting (IEDM), 2019, pp. 19.5.1-19.5.4 ,2019.

(Continued)

*Primary Examiner* — Steven M Page
(74) *Attorney, Agent, or Firm* — Winston Hsu

(57) ABSTRACT

A MIM capacitor structure includes a semiconductor substrate, and a first trench and a second trench in the semiconductor substrate in a capacitance forming region. The second trench is adjacent to the first trench. The second trench is deeper than the first trench. A dielectric liner layer conformally covers a top surface of the semiconductor substrate and interior surfaces of the first trench and the second trench. A bottom electrode layer conformally covers the dielectric liner layer. The bottom electrode layer extends onto a top surface of the semiconductor substrate. A capacitor dielectric layer is disposed on the bottom electrode layer in the first trench and the second trench. A top electrode layer is disposed on the capacitor dielectric layer in the first trench and the second trench. The top surface of the top electrode layer is coplanar with the top surface of the bottom electrode layer.

20 Claims, 7 Drawing Sheets

(56) References Cited

U.S. PATENT DOCUMENTS

2012/0211865 A1 8/2012 Tian
2021/0005707 A1* 1/2021 Lu .......................... H10D 1/716
2021/0057469 A1* 2/2021 Huang .................. H10D 1/043
2022/0278095 A1 9/2022 Kao
2023/0012211 A1* 1/2023 Jo ............................ H01G 4/35
2023/0066352 A1* 3/2023 Liu ........................ H10D 1/042

OTHER PUBLICATIONS

Z. Hu et al., Development of Low Cost Glass-Based Deep Trench Capacitor for 3D Packaging, IEEE Electron Device Letters, vol. 44, No. 9, pp. 1535-1538 ,Sep. 2023.

C. Song et al., Design and Simulation of Deep Trench Capacitor on High-Performance Silicon Interposer, 2022 23rd International Conference on Electronic Packaging Technology (ICEPT), pp. 1-6 ,2022.

* cited by examiner

METAL-INSULATOR-METAL CAPACITOR STRUCTURE

BACKGROUND OF THE INVENTION

1. Field of the Invention

The present invention relates to the field of semiconductor technology, and particularly relates to a deep trench metal-insulator-metal (MIM) capacitor structure.

2. Description of the Prior Art

To accommodate the exceedingly demanding power integrity (PI) requirements for the advanced artificial intelligence (AI) and high performance computing (HPC) components, high-K (HK) based deep trench capacitors (DTC) have been integrated the first time in the silicon interposer with through silicon via (TSV) and fine-pitch interconnects for chip-on-wafer-on-substrate (CoWoS) integration.

Since high capacitance value capacitor structures require multiple layers of metal electrodes and high dielectric constant film layers, vias are usually connected to electrodes located at different levels, forming a step height and causing the risk of via open or short circuit.

SUMMARY OF THE INVENTION

It is one object of the present invention to provide an improved metal-insulator-metal (MIM) capacitor structure in order to solve the deficiencies or shortcomings of the existing technology.

One aspect of the invention provides a metal-insulator-metal (MIM) capacitor structure including a semiconductor substrate having a capacitor forming region thereon; a first trench having a first depth, disposed in the semiconductor substrate within the capacitor forming region; a second trench having a second depth, disposed in the semiconductor substrate within the capacitor forming region, wherein the second trench is in proximity to the first trench, and wherein the second depth is greater than the first depth; a dielectric liner layer conformally covering a top surface of the semiconductor substrate, an interior surface of the first trench and an interior surface of the second trench; a bottom electrode layer conformally covering the dielectric liner layer, wherein the bottom electrode layer extending onto the top surface of the semiconductor substrate; a capacitor dielectric layer disposed on the bottom electrode layer within the first trench and the second trench; and a top electrode layer disposed on the capacitor dielectric layer within the first trench and the second trench, wherein a top surface of the top electrode layer is coplanar with a top surface of the bottom electrode layer.

According to some embodiments, the first depth ranges between 5 nm-5 μm, and the second depth ranges between 100 nm-50 μm.

According to some embodiments, the dielectric liner layer comprises silicon oxide.

According to some embodiments, the bottom electrode layer comprises TiN.

According to some embodiments, the top electrode layer comprises TiN.

According to some embodiments, the capacitor dielectric layer comprises $ZrO_2/Al_2O_3/ZrO_2$ (ZAZ) film.

According to some embodiments, the capacitor dielectric layer does not extend onto the top surface of the semiconductor substrate.

According to some embodiments, the top electrode layer does not extend onto the top surface of the semiconductor substrate.

According to some embodiments, the MIM capacitor structure further comprises a trench fill material layer filled into the second trench; a dielectric layer covering the trench fill material layer, the top electrode layer, the bottom electrode layer, and the capacitor dielectric layer; a first contact disposed in the dielectric layer and electrically connected to the bottom electrode layer; and a second contact disposed in the dielectric layer and electrically connected to a portion of the top electrode layer that is directly above the first trench.

According to some embodiments, the MIM capacitor structure further comprises a through silicon via penetrating through the dielectric layer and the semiconductor substrate.

Another aspect of the invention provides a metal-insulator-metal (MIM) capacitor structure including a semiconductor substrate having a capacitor forming region thereon; a first trench having a first depth, disposed in the semiconductor substrate within the capacitor forming region; a second trench having a second depth, disposed in the semiconductor substrate within the capacitor forming region, wherein the second trench is in proximity to the first trench, and wherein the second depth is greater than the first depth; a dielectric liner layer conformally covering a top surface of the semiconductor substrate, an interior surface of the first trench and an interior surface of the second trench; a first electrode layer conformally covering the dielectric liner layer, wherein the first electrode layer extends onto the top surface of the semiconductor substrate; a first capacitor dielectric layer disposed on the first electrode layer; a second electrode layer disposed on the first capacitor dielectric layer; a second capacitor dielectric layer disposed on the second electrode layer; and a third electrode layer disposed on the second capacitor dielectric layer. A top surface of the second electrode layer is coplanar with a top surface of the first electrode layer.

According to some embodiments, the first depth ranges between 5 nm-5 μm, and the second depth ranges between 100 nm-50 μm.

According to some embodiments, the dielectric liner layer comprises silicon oxide.

According to some embodiments, the first electrode layer, the second electrode layer, and the third electrode layer comprise TiN.

According to some embodiments, the first capacitor dielectric layer and the second capacitor dielectric layer comprise $ZrO_2/Al_2O_3/ZrO_2$ (ZAZ) film.

According to some embodiments, the third electrode layer comprises a through hole that is directly above the first trench.

According to some embodiments, the MIM capacitor structure further includes a dielectric layer covering the third electrode layer, and the second capacitor dielectric layer; a first contact penetrating through the dielectric layer, the third electrode layer, the second capacitor dielectric layer, and the first capacitor dielectric layer, wherein the first contact is electrically connected to the first electrode layer and the third electrode layer; and a second contact penetrating through the dielectric layer, the through hole of the third electrode layer, and the second capacitor dielectric layer, wherein the second contact is electrically connected to a portion of the second electrode layer that is directly above the first trench.

According to some embodiments, the MIM capacitor structure further includes a through silicon via penetrating through the dielectric layer, the dielectric liner layer, and the semiconductor substrate.

According to some embodiments, the first contact penetrates through the first electrode layer.

According to some embodiments, the first contact and the second contact comprise tungsten.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
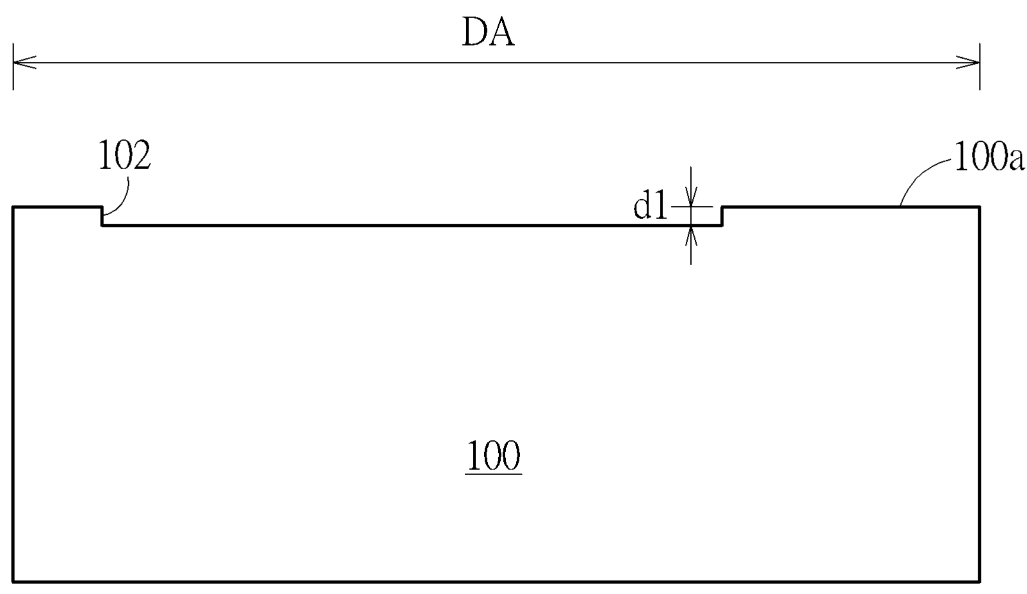
FIG. 1 to FIG. 6 are schematic diagrams showing a method of forming a MIM capacitor structure according to one embodiment of the present invention.

Please refer to FIG. 1 to FIG. 6, which are schematic diagrams showing a method of forming a metal-insulator-metal (MIM) capacitor structure according to one embodiment of the present invention. First, as shown in FIG. 1, a semiconductor substrate 100, such as a silicon substrate, is provided. According to an embodiment of the present invention, the semiconductor substrate 100 includes a capacitor forming region DA. A photolithography process and an etching process are then performed to form a first trench 102 in the semiconductor substrate 100 within the capacitor forming region DA. According to an embodiment of the present invention, the first trench 102 has a first depth d1.

Figure 2:
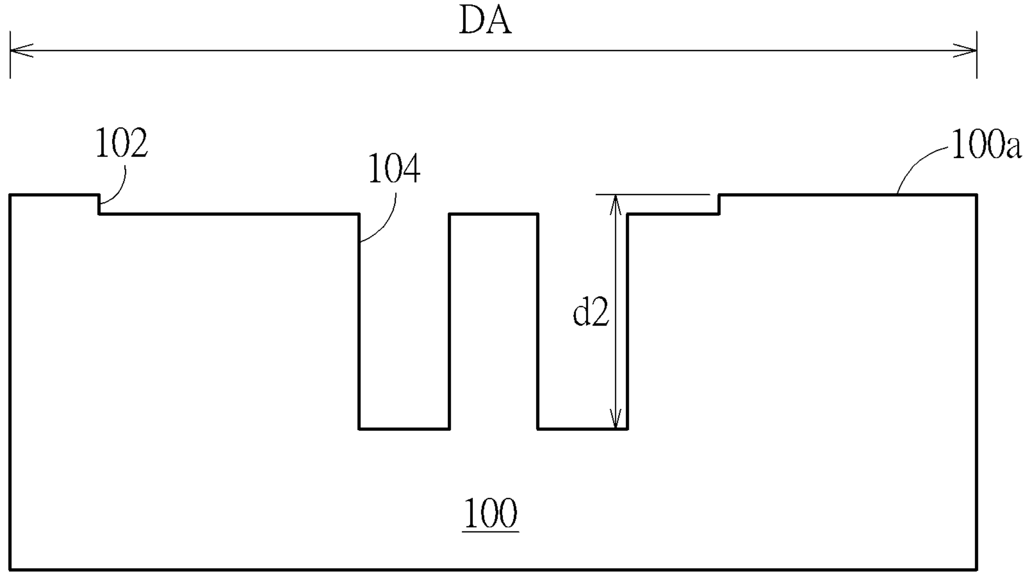

As shown in FIG. 2, a photolithography process and an etching process are performed to form a second trench 104 in the semiconductor substrate 100 within the capacitor forming region DA. According to an embodiment of the present invention, the second trench 104 may be in proximity to or connected to the first trench 102.

According to an embodiment of the present invention, the second trench 104 has a second depth d2. The second depth d2 is greater than the first depth d1. According to an embodiment of the present invention, the first depth d1 is, for example, between 5 nm and 5 μm, and the second depth d2 is, for example, between 100 nm and 50 μm.

Figure 3:
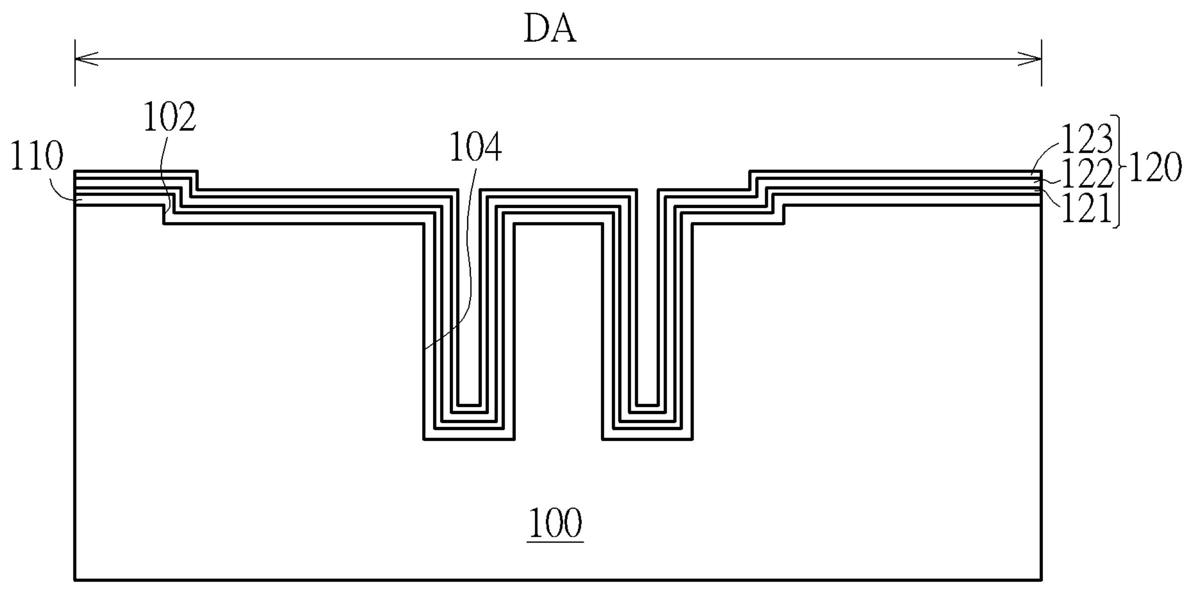

As shown in FIG. 3, a chemical vapor deposition (CVD) process, such as an atomic layer deposition (ALD) process, is then performed to conformally deposit a dielectric liner layer 110 on the top surface 100*a* of the semiconductor substrate 100 and on the interior surfaces of the first trench 102 and the second trench 104. According to an embodiment of the present invention, for example, the dielectric liner layer 110 may include silicon oxide. Subsequently, a bottom electrode layer 121, a capacitor dielectric layer 122 and a top electrode layer 123 are sequentially formed on the dielectric liner layer 110. The bottom electrode layer 121, the capacitor dielectric layer 122 and the top electrode layer 123 constitute a capacitor stack structure 120.

According to an embodiment of the present invention, for example, the bottom electrode layer 121 may include TiN. According to an embodiment of the present invention, for example, the top electrode layer 123 may include TiN. According to an embodiment of the present invention, for example, the thickness of the bottom electrode layer 121 and the top electrode layer 123 is between 200-300 angstroms, for example, 250 angstroms. According to an embodiment of the present invention, for example, the capacitor dielectric layer 122 includes a $ZrO_2/Al_2O_3/ZrO_2$ (ZAZ) film or other suitable high dielectric constant materials. According to an embodiment of the present invention, the first depth d1 of the first trench 102 may be equal to the thickness of the capacitor dielectric layer 122. According to an embodiment of the present invention, the thickness of the capacitor dielectric layer 122 is, for example, between 40-80 angstroms, for example, 60 angstroms.

Figure 4:
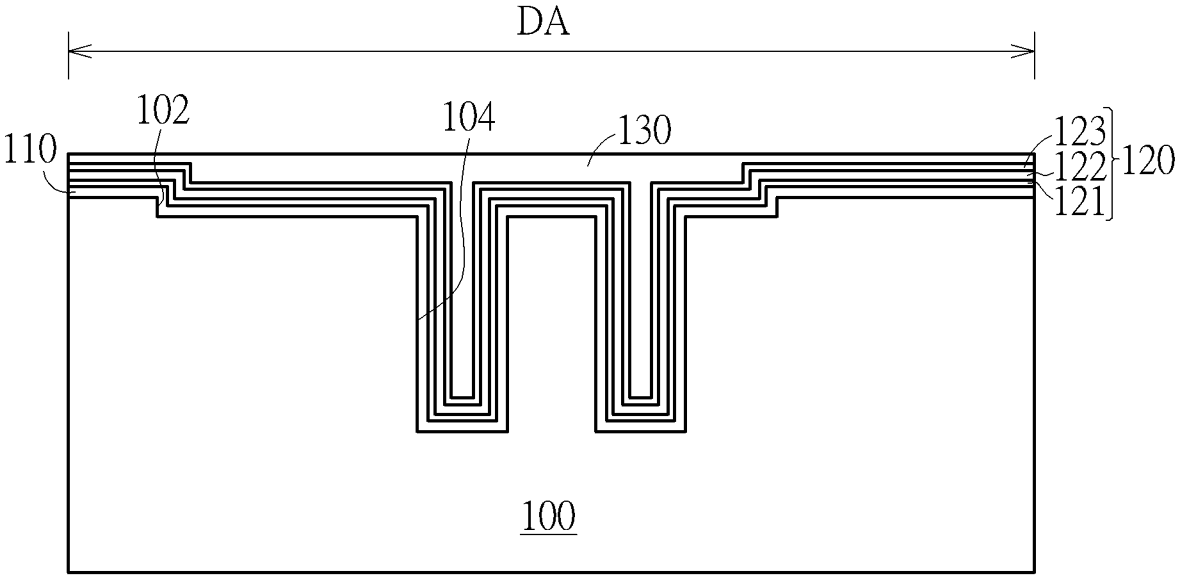

As shown in FIG. 4, a trench fill material layer 130 is then deposited on the semiconductor substrate 100 in a blanket manner. According to an embodiment of the present invention, the trench fill material layer 130 fills the second trench 104 and the first trench 102. According to an embodiment of the present invention, for example, the trench fill material layer 130 may include silicon oxide.

Figure 5:
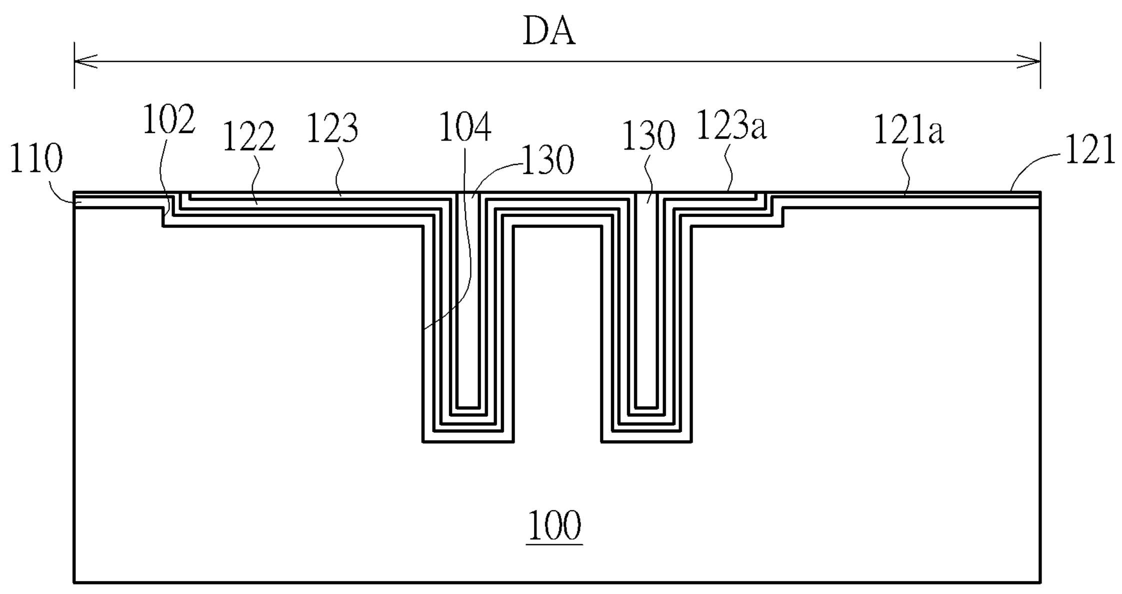

As shown in FIG. 5, a chemical mechanical polish (CMP) process is then performed to polish away part of the trench fill material layer 130, the top electrode layer 123 and the capacitor dielectric layer 122 until the bottom electrode layer 121 on the top surface 100*a* of the semiconductor substrate 100 is exposed. At this point, the trench fill material layer 130, the top electrode layer 123 and the capacitor dielectric layer 122 on the top surface 100*a* of the semiconductor substrate 100 have been removed, thereby exposing the top surface 121*a* of the bottom electrode layer 121. The top surface 123*a* of the top electrode layer 123 within the first trench 102 is coplanar with the top surface 121*a* of the bottom electrode layer 121 on the top surface 100*a* of the semiconductor substrate 100.

Figure 6:
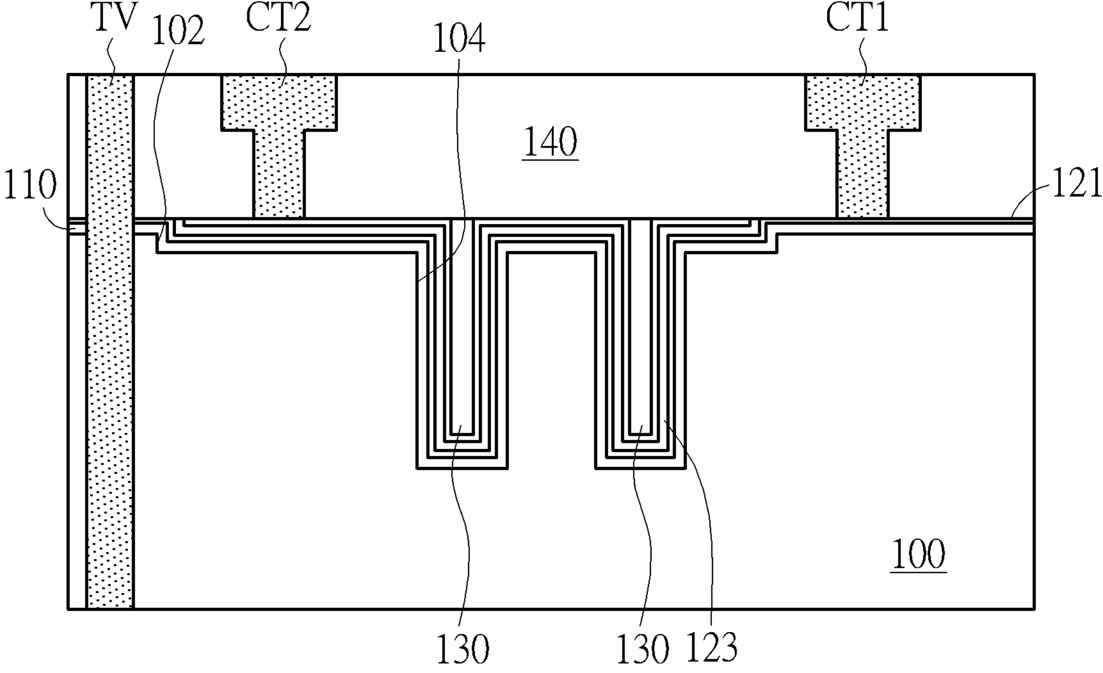

As shown in FIG. 6, a dielectric layer 140 is then deposited on the semiconductor substrate 100 in a blanket manner. The dielectric layer 140 covers the trench fill material layer 130 in the second trench 104, the top electrode layer 123 in the first trench 102, the bottom electrode layer 121 on the top surface 100*a* of the semiconductor substrate 100, and part of the capacitor dielectric layer 122. A metallization process is then performed to form a first contact CT1 and a second contact CT2, such as tungsten contacts, in the dielectric layer 140. The first contact CT1 is electrically connected to the bottom electrode layer 121, and the second contact CT2 is electrically connected to the portion of the top electrode layer 123 located directly above the first trench 102. Subsequently, through silicon vias TV may be formed in the dielectric layer 140 and the semiconductor substrate 100 through the entire thicknesses of the dielectric layer 140 and the semiconductor substrate 100.

Structurally, as shown in FIG. 6, the bottom electrode layer 121 conformally covers the dielectric liner layer 110. The bottom electrode layer 121 extends onto the top surface 100*a* of the semiconductor substrate 100. The capacitor dielectric layer 122 is disposed on the bottom electrode layer 121 in the first trench 102 and the second trench 104. The top electrode layer 123 is disposed on the capacitor dielectric layer 122 in the first trench 102 and the second trench 104. The top surface 123*a* of the top electrode layer 123 is coplanar with the top surface 121*a* of the bottom electrode layer 121. According to an embodiment of the present invention, the capacitor dielectric layer 122 does not extend onto the top surface 100*a* of the semiconductor substrate 100. According to an embodiment of the present invention, the top electrode layer 123 does not extend onto the top surface 100*a* of the semiconductor substrate 100.

Figure 7:
FIG. 7 to FIG. 14 are schematic diagrams showing a method of forming a MIM capacitor structure according to another embodiment of the present invention.
Figure 7:
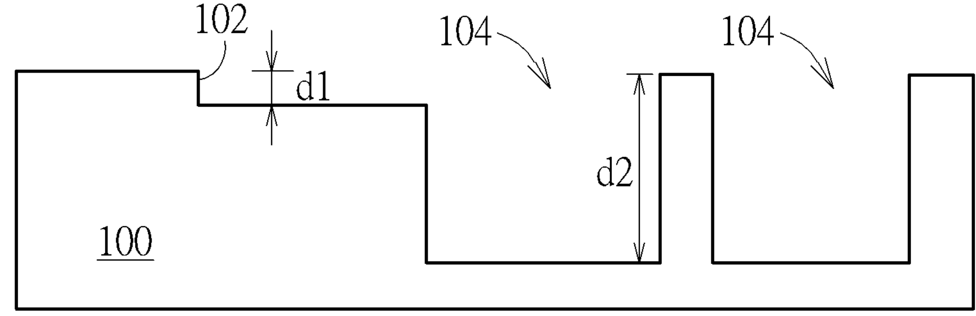

Please refer to FIG. 7 to FIG. 14, which are schematic diagrams showing a method of forming a MIM capacitor structure according to another embodiment of the present invention, wherein like regions, elements or layers are still represented by like numeral numbers or labels. As shown in FIG. 7, a semiconductor substrate 100, such as a silicon substrate, is provided. According to an embodiment of the present invention, the semiconductor substrate 100 includes a capacitor forming region DA. A photolithography process and an etching process are then performed to form a first trench 102 in the semiconductor substrate 100 within the capacitor forming region DA. According to an embodiment of the present invention, the first trench 102 has a first depth d1.

A photolithography process and an etching process are performed to form a second trench 104 in the semiconductor substrate 100 within the capacitor forming region DA. According to an embodiment of the present invention, the second trench 104 may be adjacent to or connected to the first trench 102. According to an embodiment of the present invention, the second trench 104 has a second depth d2. The second depth d2 is greater than the first depth d1. According to an embodiment of the present invention, the first depth d1 is, for example, between 5 nm and 5 μm, and the second depth d2 is, for example, between 100 nm and 50 μm.

Figure 8:
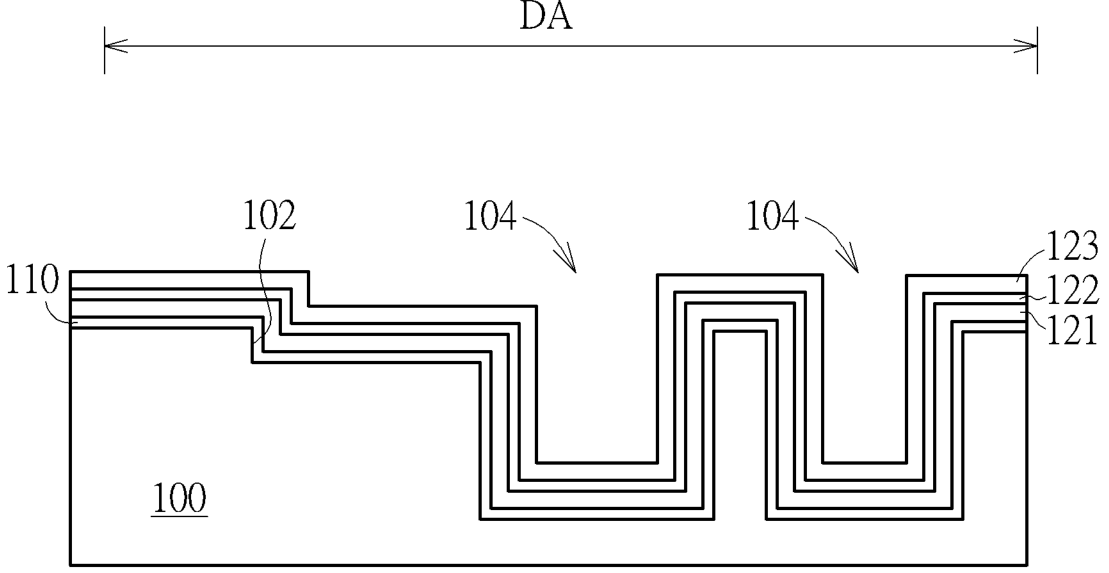

As shown in FIG. 8, a chemical vapor deposition (CVD) process, such as an atomic layer deposition (ALD) process, is then performed to conformally deposit a dielectric liner layer 110 on the top surface 100*a* of the semiconductor substrate 100 and on the interior surfaces of the first trench 102 and the second trench 104. According to an embodiment of the present invention, for example, the dielectric liner layer 110 may include silicon oxide. Subsequently, a first electrode layer 121, a first capacitor dielectric layer 122 and a second electrode layer 123 are sequentially formed on the dielectric liner layer 110.

Figure 9:
Figure 9:
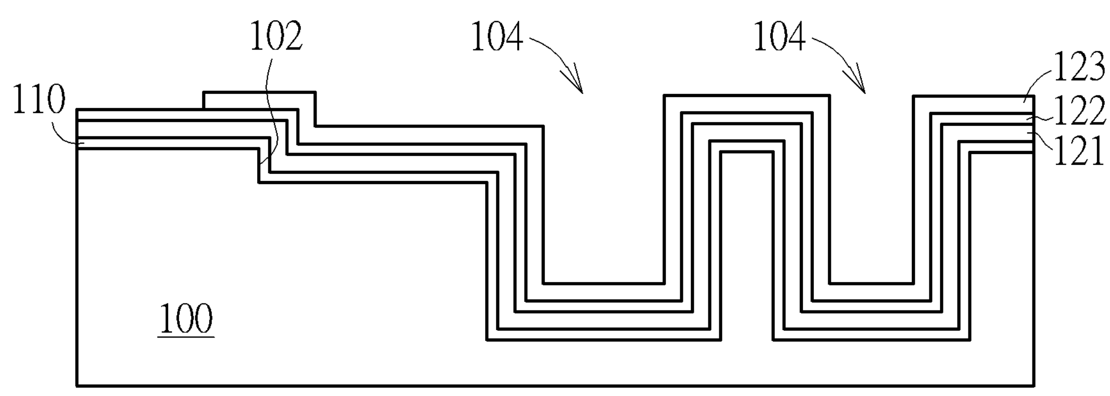

As shown in FIG. 9, a photolithography process and an etching process are then performed to remove part of the second electrode layer 123 on the top surface 100*a* of the semiconductor substrate 100, thereby exposing part of the first capacitor dielectric layer 122 on the top surface 100*a* of the semiconductor substrate 100.

Figure 10:
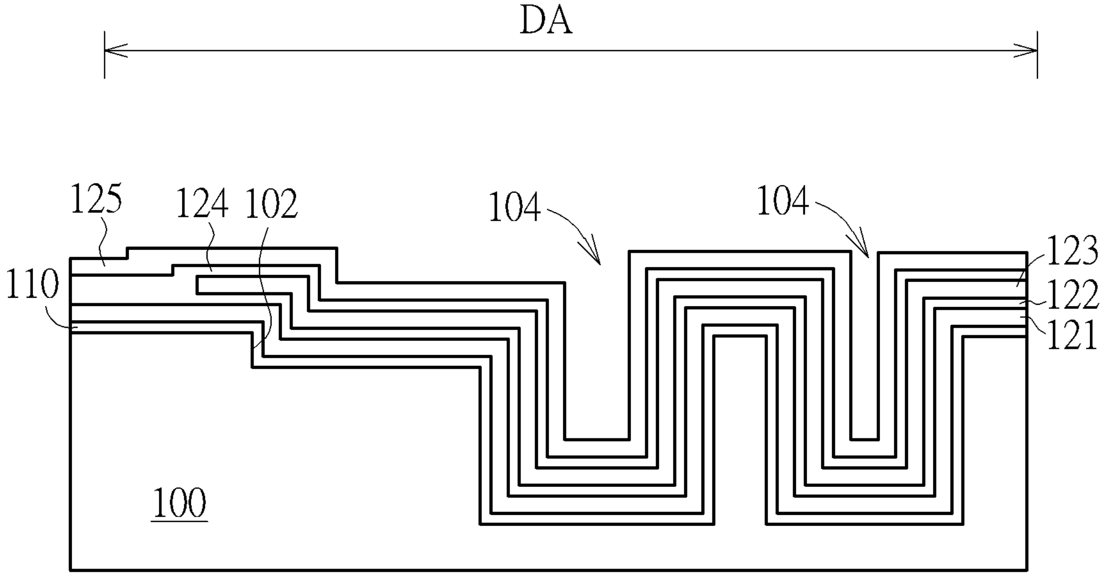

As shown in FIG. 10, a second capacitor dielectric layer 124 and a third electrode layer 125 are deposited on the semiconductor substrate 100 in a blanket manner. According to an embodiment of the present invention, for example, the first electrode layer 121, the second electrode layer 123, and the third electrode layer 125 may include TiN. According to an embodiment of the present invention, for example, the thicknesses of the first electrode layer 121, the second electrode layer 123, and the third electrode layer 125 may range from 200 to 300 angstroms, for example, 250 angstroms. According to an embodiment of the present invention, for example, the first capacitor dielectric layer 122 and the second capacitor dielectric layer 124 may include a $ZrO_2/Al_2O_3/ZrO_2$ (ZAZ) film or other suitable high dielectric constant materials. According to an embodiment of the present invention, the first depth d1 of the first trench 102 may be equal to the thickness of the first capacitor dielectric layer 122. According to an embodiment of the present invention, the thickness of the first capacitor dielectric layer 122 is, for example, between 40-80 angstroms, for example, 60 angstroms.

Figure 11:
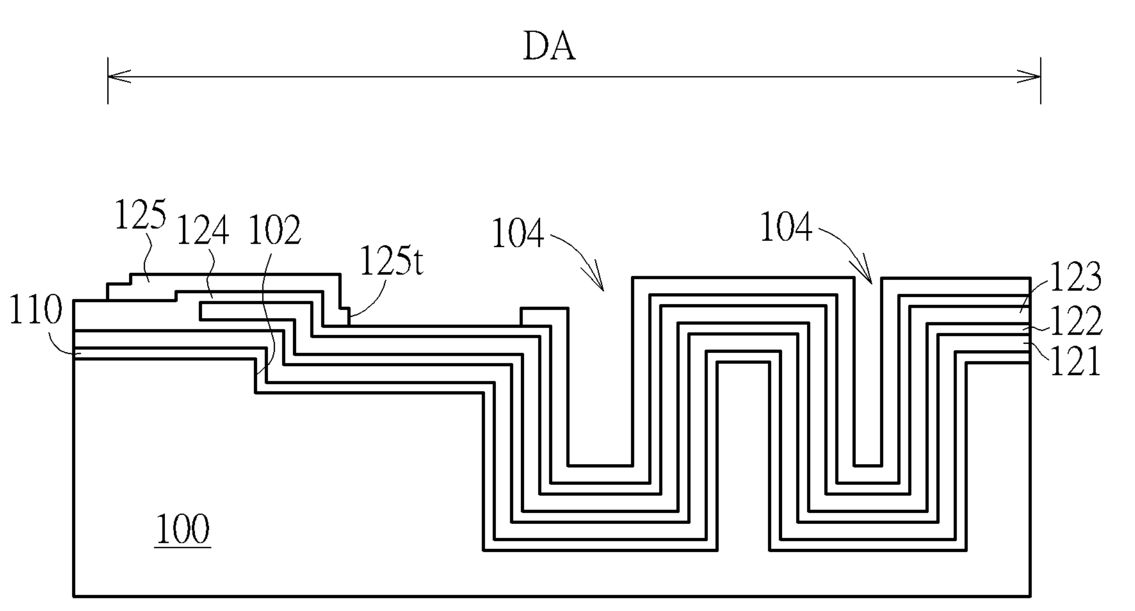

As shown in FIG. 11, a photolithography process and an etching process are then performed to remove part of the third electrode layer 125 on the top surface 100*a* of the semiconductor substrate 100 and the first trench 102. At this point, a through hole 125*t* is formed in the third electrode layer 125 directly above the first trench 102, exposing part of the second capacitor dielectric layer 124.

Figure 12:
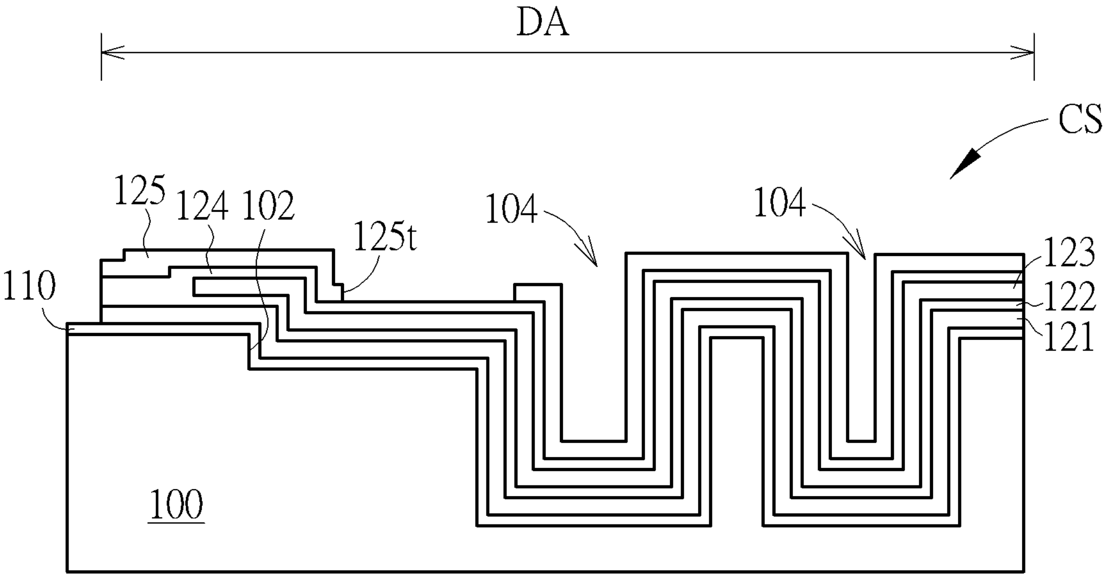

As shown in FIG. 12, a photolithography process and an etching process are then performed to remove part of the second capacitor dielectric layer 124, the first capacitor dielectric layer 122 and the first electrode layer 121 on the top surface 100*a* of the semiconductor substrate 100. A portion of the dielectric liner layer 110 is exposed, thereby forming a multi-electrode capacitor structure CS.

Figure 13:
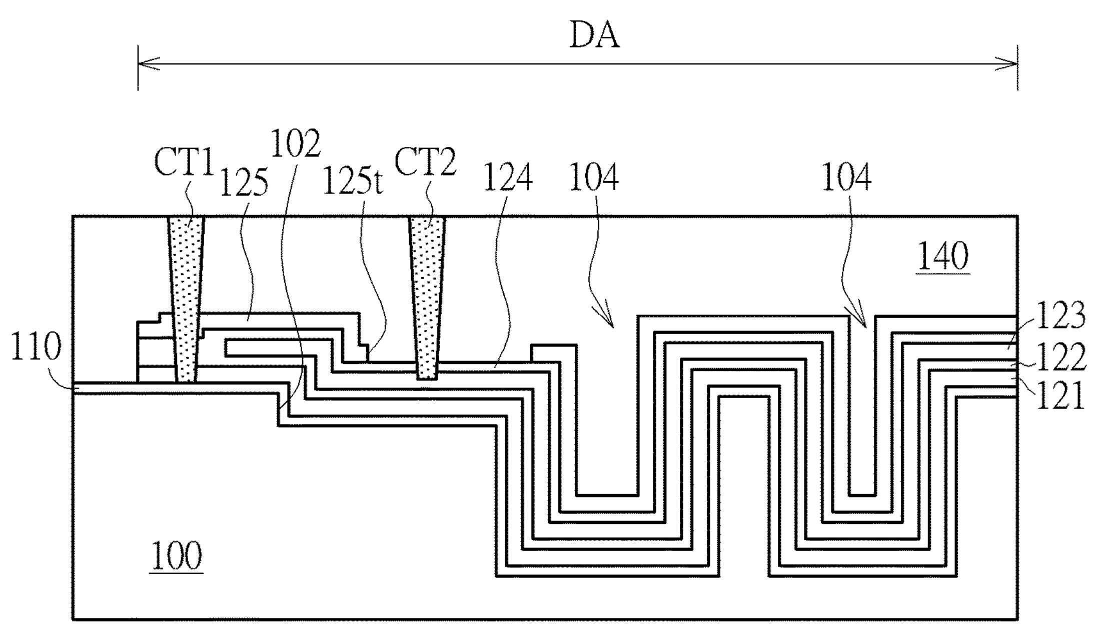

As shown in FIG. 13, a dielectric layer 140 is deposited on the semiconductor substrate 100 in a blanket manner. The dielectric layer 140 covers the multi-electrode capacitor structure CS. According to an embodiment of the present invention, the dielectric layer 140 covers and directly contacts the third electrode layer 125 and the second capacitor dielectric layer 124. A metallization process is then performed to form first contacts CT1 and second contacts CT2, such as tungsten contacts, in the dielectric layer 140.

According to an embodiment of the present invention, the first contact CT1 penetrates the dielectric layer 140, the third electrode layer 125, the second capacitor dielectric layer 124 and the first capacitor dielectric layer 122. The first contact CT1 is electrically connected to the first electrode layer 121 and the third electrode layer 125.

According to an embodiment of the present invention, the second contact CT2 penetrates the dielectric layer 140, the through hole 125*t* of the third electrode layer 125, and the second capacitor dielectric layer 124. The second contact CT2 is electrically connected to the portion of the second electrode layer 123 located directly above the first trench 102.

Figure 14:
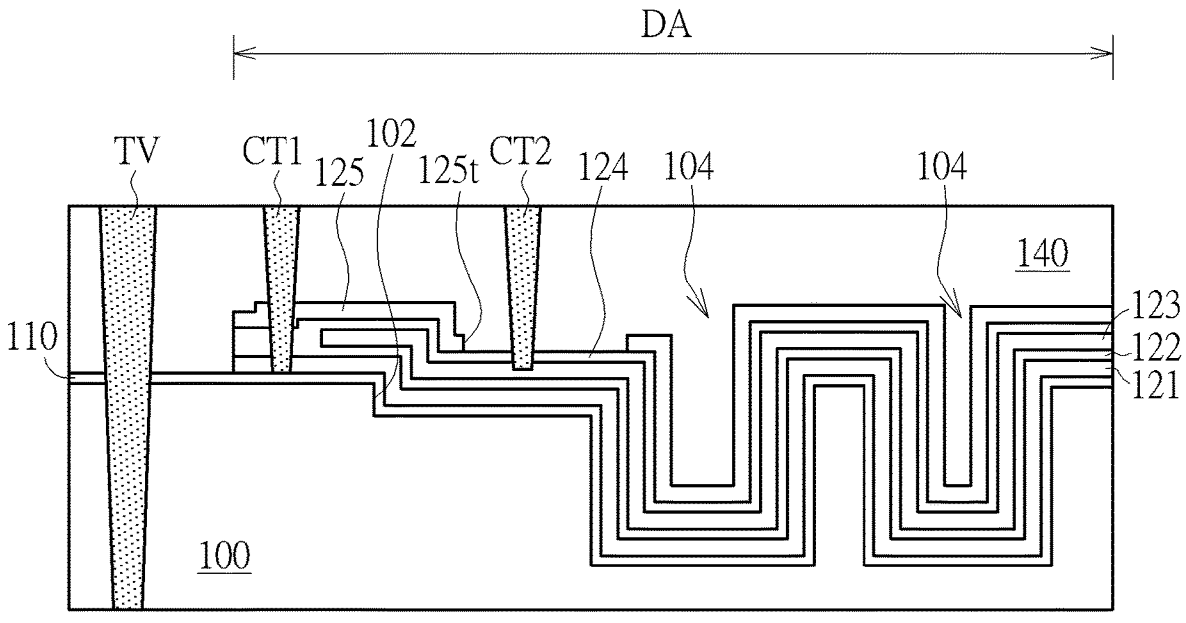

As shown in FIG. 14, through silicon vias TV may be formed through the entire thicknesses of the dielectric layer 140, the dielectric liner layer 110 and the semiconductor substrate 100. Subsequently, the metallization process may be continued to form an interconnect structure on the dielectric layer 140. For the sake of simplicity, the details of the interconnect structure is not described herein.

Structurally, as shown in FIG. 14, the first electrode layer 121 conformally covers the dielectric liner layer 110. The first electrode layer 110 extends to the top surface 100*a* of the semiconductor substrate 100. The first capacitor dielectric layer 122 is disposed on the first electrode layer 121. The second electrode layer 123 is disposed on the first capacitor dielectric layer 122. The second capacitor dielectric layer 124 is disposed on the second electrode layer 123. The third electrode layer 125 is disposed on the second capacitor dielectric layer 124. The top surface of the second electrode layer 123 is coplanar with the top surface of the first electrode layer 121. According to an embodiment of the present invention, the first contact CT1 can penetrate through the first electrode layer 121.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-insulator-metal (MIM) capacitor structure, comprising:
- a semiconductor substrate having a capacitor forming region thereon;
- a first trench having a first depth, disposed in the semiconductor substrate within the capacitor forming region;
- a second trench having a second depth, disposed in the semiconductor substrate within the capacitor forming region, wherein the second trench is in proximity to the first trench, and wherein the second depth is greater than the first depth;
- a dielectric liner layer conformally covering a top surface of the semiconductor substrate, an interior surface of the first trench and an interior surface of the second trench;
- a bottom electrode layer conformally covering the dielectric liner layer, wherein the bottom electrode layer extending onto the top surface of the semiconductor substrate;
- a capacitor dielectric layer disposed on the bottom electrode layer within the first trench and the second trench; and
- a top electrode layer disposed on the capacitor dielectric layer within the first trench and the second trench, wherein a top surface of the top electrode layer is coplanar with a top surface of the bottom electrode layer.

2. The MIM capacitor structure according to claim 1, wherein the first depth ranges between 5 nm-5 μm, and the second depth ranges between 100 nm-50 μm.

3. The MIM capacitor structure according to claim 1, wherein the dielectric liner layer comprises silicon oxide.

4. The MIM capacitor structure according to claim 1, wherein the bottom electrode layer comprises TiN.

5. The MIM capacitor structure according to claim 1, wherein the top electrode layer comprises TiN.

6. The MIM capacitor structure according to claim 1, wherein the capacitor dielectric layer comprises $ZrO_2/Al_2O_3/ZrO_2$ (ZAZ) film.

7. The MIM capacitor structure according to claim 1, wherein the capacitor dielectric layer does not extend onto the top surface of the semiconductor substrate.

8. The MIM capacitor structure according to claim 1, wherein the top electrode layer does not extend onto the top surface of the semiconductor substrate.

9. The MIM capacitor structure according to claim 1 further comprising:
- a trench fill material layer filled into the second trench;
- a dielectric layer covering the trench fill material layer, the top electrode layer, the bottom electrode layer, and the capacitor dielectric layer;
- a first contact disposed in the dielectric layer and electrically connected to the bottom electrode layer; and
- a second contact disposed in the dielectric layer and electrically connected to a portion of the top electrode layer that is directly above the first trench.

10. The MIM capacitor structure according to claim 9 further comprising:
- a through silicon via penetrating through the dielectric layer and the semiconductor substrate.

11. A metal-insulator-metal (MIM) capacitor structure, comprising:
- a semiconductor substrate having a capacitor forming region thereon;
- a first trench having a first depth, disposed in the semiconductor substrate within the capacitor forming region;
- a second trench having a second depth, disposed in the semiconductor substrate within the capacitor forming region, wherein the second trench is in proximity to the first trench, and wherein the second depth is greater than the first depth;
- a dielectric liner layer conformally covering a top surface of the semiconductor substrate, an interior surface of the first trench and an interior surface of the second trench;
- a first electrode layer conformally covering the dielectric liner layer, wherein the first electrode layer extends onto the top surface of the semiconductor substrate;
- a first capacitor dielectric layer disposed on the first electrode layer;
- a second electrode layer disposed on the first capacitor dielectric layer;
- a second capacitor dielectric layer disposed on the second electrode layer; and
- a third electrode layer disposed on the second capacitor dielectric layer, wherein a top surface of the second electrode layer is coplanar with a top surface of the first electrode layer.

12. The MIM capacitor structure according to claim 11, wherein the first depth ranges between 5 nm-5 μm, and the second depth ranges between 100 nm-50 μm.

13. The MIM capacitor structure according to claim 11, wherein the dielectric liner layer comprises silicon oxide.

14. The MIM capacitor structure according to claim 11, wherein the first electrode layer, the second electrode layer, and the third electrode layer comprise TiN.

15. The MIM capacitor structure according to claim 11, wherein the first capacitor dielectric layer and the second capacitor dielectric layer comprise $ZrO_2/Al_2O_3/ZrO_2$ (ZAZ) film.

16. The MIM capacitor structure according to claim 11, wherein the third electrode layer comprises a through hole that is directly above the first trench.

17. The MIM capacitor structure according to claim 11 further comprising:
- a dielectric layer covering the third electrode layer, and the second capacitor dielectric layer;
- a first contact penetrating through the dielectric layer, the third electrode layer, the second capacitor dielectric layer, and the first capacitor dielectric layer, wherein the first contact is electrically connected to the first electrode layer and the third electrode layer; and
- a second contact penetrating through the dielectric layer, the through hole of the third electrode layer, and the second capacitor dielectric layer, wherein the second contact is electrically connected to a portion of the second electrode layer that is directly above the first trench.

18. The MIM capacitor structure according to claim 17 further comprising:
- a through silicon via penetrating through the dielectric layer, the dielectric liner layer, and the semiconductor substrate.

19. The MIM capacitor structure according to claim 17, wherein the first contact penetrates through the first electrode layer.

20. The MIM capacitor structure according to claim 17, wherein the first contact and the second contact comprise tungsten.

* * * * *